United States Patent [19]
Vogley et al.

[11] Patent Number: 6,064,254
[45] Date of Patent: May 16, 2000

[54] HIGH SPEED INTEGRATED CIRCUIT INTERCONNECTION HAVING PROXIMALLY LOCATED ACTIVE CONVERTER

[75] Inventors: Wilbur C. Vogley, Missouri City; Jonathan H. Shiell, Plano, both of Tex.

[73] Assignee: Texas Instruments Incorporated, Dallas, Tex.

[21] Appl. No.: 09/000,691

[22] Filed: Dec. 30, 1997

[51] Int. Cl.[7] .................................................. H01L 25/00
[52] U.S. Cl. ........................ 327/565; 361/809; 361/820
[58] Field of Search ................................... 327/564–566; 361/807, 809, 820; 439/71, 74, 331, 620

[56] References Cited

U.S. PATENT DOCUMENTS

| | | | |
|---|---|---|---|
| 4,993,956 | 2/1991 | Pickles et al. | 439/74 |
| 5,118,300 | 6/1992 | Zarreii | 439/331 |
| 5,384,692 | 1/1995 | Jaff | 361/807 |

*Primary Examiner*—Kenneth B. Wells
*Attorney, Agent, or Firm*—Robert D. Marshall, Jr.; Gerald E. Laws; Richard L. Donaldson

[57] ABSTRACT

An active integrated circuit socket includes plural pin sockets receiving corresponding pins of an integrated circuit and plural socket pins making electrical contact with a printed circuit board. At least one active electronic component requiring electrical power for operation connects a pin sockets to a corresponding socket pin. The active electronic component may be a single ended input to differential output driver, a differential input to single ended output driver, a single ended to differential input/output transceiver or a voltage level shifter. These active components may include passive termination resistors. The single ended to differential transceiver may further include an enable input determining the direction of data transmission. This invention may be employed as an electronic system upgrade product including at least two active integrated circuit sockets connected via a flexible sheet including a plurality of electrical conductors connecting differential signal lines. The flexible sheet may dispose a grounded conductor between each pair of differential signal conductors. The differential signals on the printed circuit board or the flexible sheet enabled by this invention are better able to support high speed data transfer than the single ended signals at the pins of the integrated circuits.

12 Claims, 2 Drawing Sheets

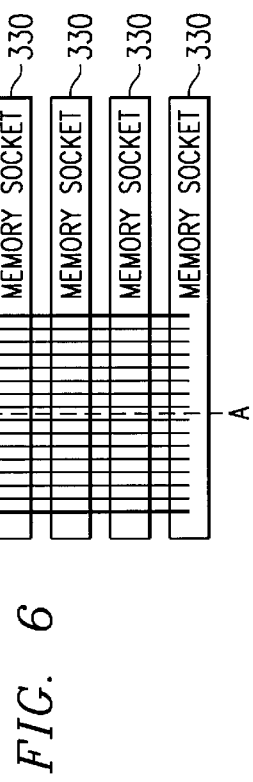
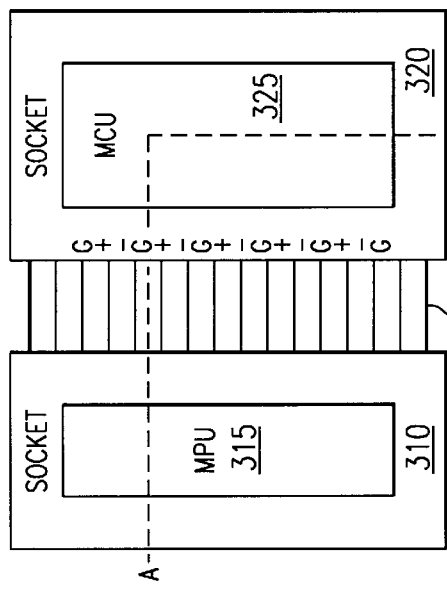
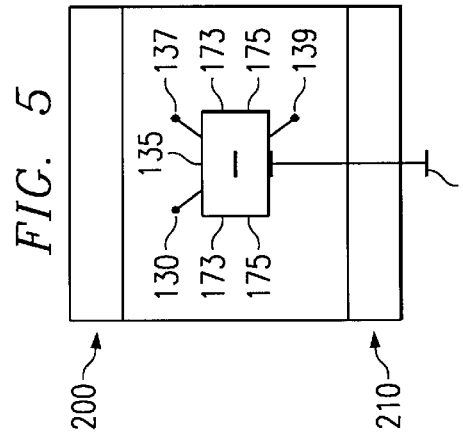
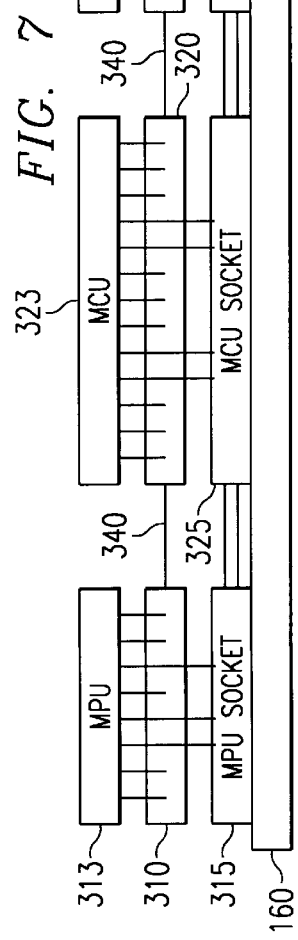

HIGH SPEED INTEGRATED CIRCUIT INTERCONNECTION HAVING PROXIMALLY LOCATED ACTIVE CONVERTER

TECHNICAL FIELD OF THE INVENTION

The technical field of this invention is interconnections between integrated circuits such as on a printed circuit board.

BACKGROUND OF THE INVENTION

There is a current trend in computer architecture to faster and faster microprocessors. Increasing the rate of operation of microprocessors increases the computation capacity of the computer system which also requires a consequent increase in the rate of data transfer into and out of the microprocessor. Otherwise, the microprocessor will stall waiting for external data transfers, such as into and out of the main computer system memory or external cache memory. Thus, the computational capacity of the computer would be limited not by the rate of operation of the microprocessor but by the data transfer rate with external memories.

There are several approaches to increasing the data transfer rate between the microprocessor and the memory system. First, the number of lines between the microprocessor and the memory system may be increased. It is now typical to provide 32 bit data and address busses. More advanced systems may provide data and address busses of 64 bits or 128 bits. Second, the rate of data transfer on each line between the microprocessor and the memory system may be increased.

Each of these techniques carries consequent disadvantages. Increasing the number of lines between the microprocessor and the memory system requires that the integrated circuits embodying these parts include more pins. Integrated circuit packages with large number of pins are more expensive. In addition, current high capacity microprocessors typically support plural separate busses. The first is the system bus. This is typically connected to a memory controller that interfaces with the memory system and parts of the computer system peripheral to the microprocessor. These peripheral parts include input devices, storage devices and the like. Another is a private cache bus connected to fast static random access memory (SRAM) used as instruction and data cache. Additionally, current high capacity microprocessors may also include additional private busses connected to other parts of the computer system such as graphics. With such a large number of busses already connected to the microprocessor, increasing the bus width of one or more of these busses could add greatly to the number of pin needed in the integrated circuit package. As an example, the Pentium Pro microprocessor package includes 387 pins. Of these 387 pins, 64 pins are dedicated to communication with a level two memory cache and 64 pins are dedicated to the external system bus. Conversion of these signals to differential signals on the same integrated circuit would require the package to include over 500 pins. Such an integrated circuit package would be very expensive.

Increasing the speed of data transfer of each bus line has other disadvantages. Integrated circuits embodying the microprocessor and the memories are generally constructed of complementary metal oxide semiconductor (CMOS). These type circuits generally require more power when operating at higher speeds. In portable devices, minimal electrical power consumption is very desirable. Even in line powered applications, excess power requirements are a problem. Electrical power consumption causes heat within the integrated circuit. High heat generation due to electrical power consumption may require aggressive heat management techniques. These include more expensive packaging and fans to greater airflow. These problems with heat generation are greater for externally connected lines than for lines included within the integrated circuit. Lines within the integrated circuit are generally shorter and smaller than externally connected lines. Thus, these lines have a lower capacitance than externally connected lines. Consequently, the line drivers for externally connected lines must switch more charge than those for internal lines. This requires larger MOS devices in the external drivers to switch the larger required currents. Thus, power consumption and heat dissipation become problems.

One method to reduce the amount of charge switched is to reduce the voltages used. In the foreseeable future, high speed busses may use voltage limits as low as 1 volt. This low voltage is close to the voltage threshold of MOS devices, that is the minimum required gate voltage to switch the channel to conduct. Thus further significant reductions in the voltages used is not expected due to reduced noise margins in the signal lines. Switching from single lines to differentially driven lines would enable greater speeds of data transfer by enhancing the noise margin. However, providing differential drivers and receivers on the integrated circuits would greatly increase the number of pins required. This would increase the cost of the integrated circuit package. Accordingly, none of these proposed solutions has been widely adopted.

SUMMARY OF THE INVENTION

One aspect of this invention is an active integrated circuit socket. This active integrated circuit socket includes plural pin sockets receiving corresponding pins of an integrated circuit and plural socket pins making electrical contact with a printed circuit board. At least one active electronic component requiring electrical power for operation connects a pin sockets to a corresponding socket pin. Some of pin sockets may be passed directly to a corresponding socket pin. These pass through pins may include a passive termination resistor.

The active electronic component may be a single ended input to differential output driver, a differential input to single ended output driver, a single ended to differential input/output transceiver or a voltage level shifter. These active components may include passive termination resistors. The single ended to differential transceiver may further include an enable input determining the direction of data transmission.

Another aspect of this invention is electronic system upgrade product. The electronic system upgrade product includes at least two active integrated circuit sockets connected via a flexible sheet including a plurality of electrical conductors connecting differential signal lines. The flexible sheet may dispose a grounded conductor between each pair of differential signal conductors.

The differential signals on the printed circuit board or the flexible sheet enabled by this invention are better able to support high speed data transfer than the single ended signals at the pins of the integrated circuits. The distances between the active circuits in the socket and the corresponding integrated circuits are very short with low line capacitance so that operating these single ended lines at the same high speed as the differential signal lines is feasible. A system employing this invention would have the advantages of high speed data movement between integrated circuits without requiring an increase in the number of pins and a more expensive package.

BRIEF DESCRIPTION OF THE DRAWINGS

These and other aspects of this invention are illustrated in the drawings, in which:

FIG. 5 is a cross sectional view of the smart socket of this invention illustrating thermal dissipation devices coupled to the circuits of this invention;

FIG. 6 illustrates a top plan view of an upgrade component according to an alternative embodiment of this invention;

FIG. 7 illustrates a sectional view of the upgrade product illustrated in FIG. 6.

DETAILED DESCRIPTION OF PREFERRED EMBODIMENTS

Figure 1:
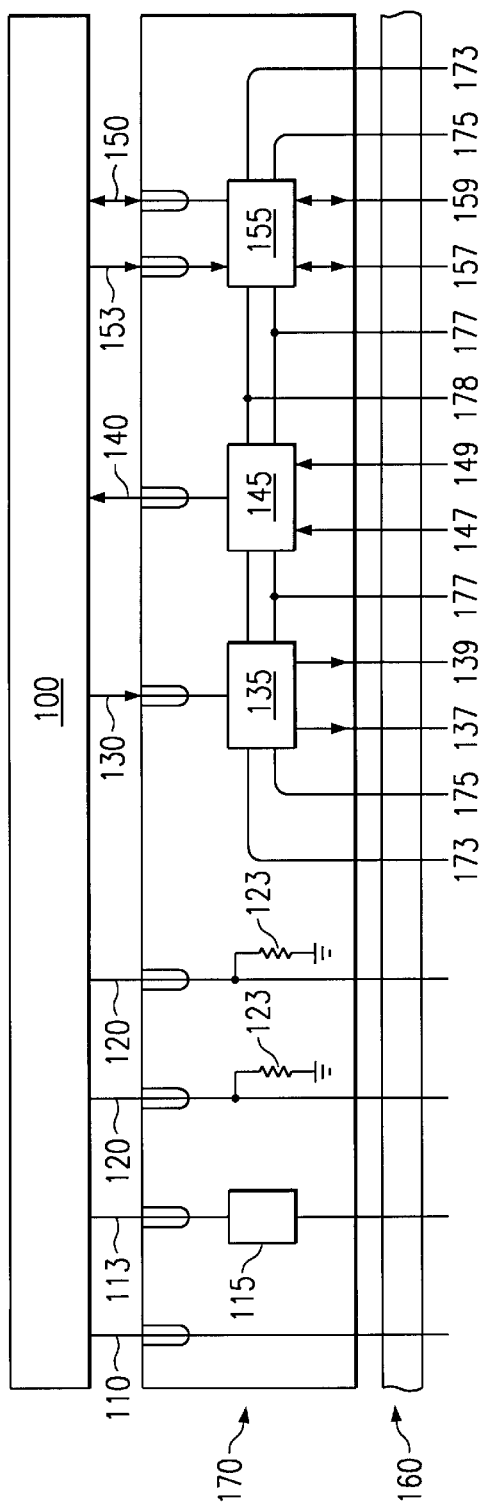
FIG. 1 is a cross sectional view illustrating the relationship of an integrated circuit and the smart socket according to one embodiment of the invention.

FIG. 1 illustrates the relationship between an integrated circuit having plural input and output lines and the smart socket of this invention. Integrated circuit 100 may include six types of lines. The first two types of lines do not employ the present invention. The first of these two types is line 110. Line 110 passes from a socket accommodating one pin of integrated circuit 100 to a pin which couples to a suitable printed circuit conductor on printed circuit board 160. An example of lines of this first type include power, ground and mode pins. These types of signals do not require high speed switching and thus do not require the present invention. This connection is according to the known art. Line 120 passes from the socket accommodating a corresponding pin of integrated circuit 100 also coupled to a suitable printed circuit conductor on printed circuit board 160. Line 120 also includes passive termination resistors 123 connecting the lines to ground. These termination resistors each have a resistance about the impedance of the printed circuit line connected to the socket. This matching resistance serves to minimize reflections at the socket and integrated circuit of signals on the printed circuit line. Minimization of such reflections reduces ringing on the line, which contributes to noise and reduces the speed of operation of the line. These type of passive termination resistors located in an integrated circuit socket are known in the art. Amp Connectors sells such sockets for use in Eurocard bus systems.

Figure 2:
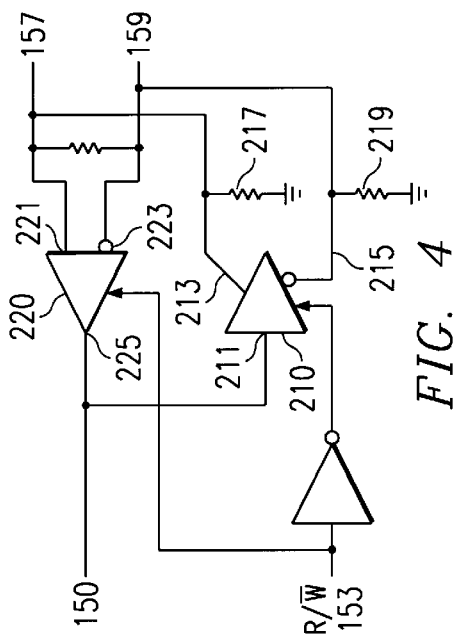
FIG. 2 is a schematic diagram of a suitable prior art buffer circuit for converting a single ended output signal from the integrated circuit into a differential output signal.

There are four types of lines which employ the active circuits of this invention. Active circuits as used in this application refer to circuits which require supply of electric power to operate. Passive components such as resistors or capacitors do not require electric power to operate. These include output line 130, input line 140, input/output line 150 and level shifted line 113. Lines 130, 140 and 150 are similarly connected to respective active buffers 135, 145 and 155. Line 113 is connected to level shifter 115, which will be further described below. Integrated circuit output lines 130 are outputs from integrated circuit 100. These outputs are each transmitted on a single line. The digital state of the output signal depends upon whether the voltage on the single output line is above or below a threshold voltage. The actual threshold voltage used for a particular integrated circuit is generally determined by the power supply voltage employed by that integrated circuit. The threshold voltage is generally about one half the power supply voltage. This output signal of each of the lines 130 is converted into a differential output signal on lines 137 and 139 via driver 135. An exemplary embodiment of buffer 135 is illustrated in FIG. 2. This buffer is known in the art and shown only for completeness. Single ended input driver 210 detects whether the voltage on line 130 at input 211 is above or below a threshold voltage. If the detected voltage is above the threshold voltage, then driver 210 drives output 213 connected to line 137 high and output 215 connected to line 139 low. If the detected voltage is below the threshold voltage, then driver 210 drives output 213 connected to line 137 low and output 215 connected to line 139 high. In all cases driver 210 drives the outputs 213 and 215 oppositely. Termination resistors 217 and 219 are optional. If provided, these termination resistors 217 and 219 are selected to have a resistance equal to the impedance of lines 213 and 215 at the signal frequency. Termination resistors 217 and 219 prevent reflections at the output of driver 210.

Figure 3:
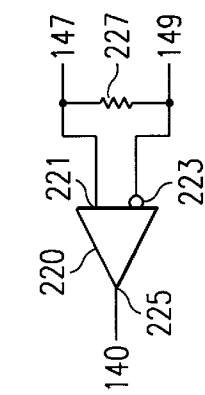
FIG. 3 is a schematic diagram of a suitable prior art buffer circuit for converting a differential input signal into a single ended input signal to the integrated circuit.

Line 140 is an input to the integrated circuit. Circuits internal to integrated circuit 100 sense the digital state of the signal on line 140 by detecting if the voltage on that line is above or below a threshold voltage. Buffer 145 receives a differential input signal on lines 147 and 149 and converts this to a single ended signal having the corresponding threshold voltage for line 140. An exemplary embodiment of buffer 145 is illustrated in FIG. 3. This buffer is known in the art and shown only for completeness. Differential input single ended output receiver 220 detects the difference in voltage between its input 221 connected to line 147 and its input 223 connected to line 149. Receiver 220 produces a single ended output on output 225 connected to line 140. If the voltage on input 221 connected to line 147 is above the voltage on input 223 connected to line 149, then the output 225 is line 140 of receiver 220 on driven above the threshold voltage. If the voltage on input 221 connected to line 147 is below the voltage on input 223 connected to line 149, then the output 225 connected to line 140 of receiver 220 is driven below the threshold voltage. Termination resistor 227 is optional. As explained above, the resistance of termination resistor 227 is selected to match the impedance between lines 221 and 223 at the signal frequency.

Line 150 is both an input to the integrated circuit and an output from the integrated circuit. Microprocessors and memories often employ a single data bus for bidirectional data transfer. Thus during some cycles the microprocessor supplies data to the memory to be stored. During other cycles the memory recalls previously stored data that is supplied to the microprocessor. This is generally achieved by connecting the input level sensor and the output driver to the same line. Depending on the operating mode either the input level sensor or the output driver is active. The other buffer is inactive during that cycle. It is typical for the inactive buffer to present a high impedance to the line. Buffer 155 provides conversion between a single ended input or output on line 150 to a differential input or output depending on the direction of data transfer. If integrated circuit 100 is generating data to supply to other systems, then buffer 155 converts the single ended output signal into a differential output signal for supply to other circuits. In this condition, integrated circuit 100 produces a signal on line 153 indicating a write operation. If integrated circuit 100 is receiving data supplied by other circuits, then buffer 155 converts the differential inputs into a single ended signal having the corresponding threshold voltage. In this condition, integrated circuit 100 produces a read signal on line 153 indicating a read operation.

Figure 4:
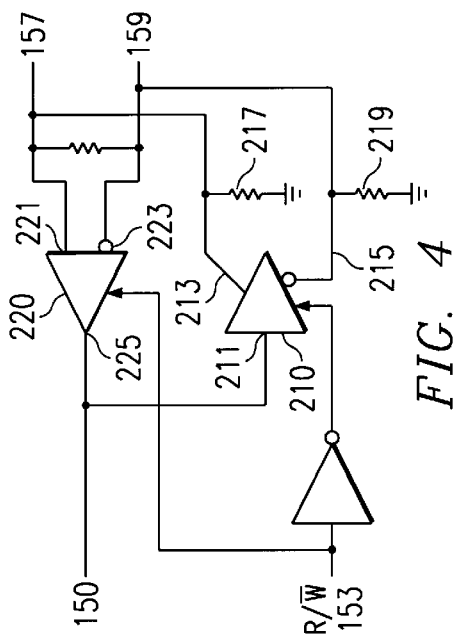
FIG. 4 is a schematic diagram of a suitable prior art buffer circuit for converting a single ended input/output signal to/from the integrated circuit into a differential input/output signal.

An exemplary embodiment of buffer 155 is illustrated in FIG. 4. This buffer is known in the art and shown only for completeness. This buffer is primarily a combination of buffer 135 illustrated in FIG. 2 and buffer 145 illustrated in FIG. 3. Similar reference numbers are used in FIG. 4. The bidirectional buffer 155 illustrated in FIG. 4 includes additional circuits to prevent interference between driver 210 and receiver 220. Both driver 210 and receiver 220 include an additional enable input. Each buffer is enabled by a high enable input signal and disabled by a low enable input signal. The enable inputs of buffers 210 and 220 are commonly connected to a read/not write (R/~W) input 230 on line 153 (FIG. 1). The read/not write input 230 on line 153 is produced by the microprocessor. The signal on R/~W input 230 on line 153 indicates whether the microprocessor is reading, i.e. receiving data, or writing, i.e. supplying data. Driver 210 is enabled during writes to supply data from the microprocessor to the bus. Receiver 220 is disabled during writes. Receiver 220 is enabled during reads to supply data from the bus to the microprocessor. Driver 210 is disabled during reads. Note that the microprocessor R/~W signal is merely an example of a control signal indicating the direction of data transfer. Such a signal is typically generated by a master device having control of the direction of data transfer on the bidirectional bus.

Suitable buffers for embodying this invention will be similar to the dual differential transceivers TK1A, TL1A and TM1A sold by Lucent Technologies. These parts include two differential input single ended output receiver buffers and two single ended input differential output driver buffers. These parts also include an enable input line for the pair of receivers and a separate enable input line for the pair of drivers. These parts differ in that TK1A includes no termination resistors, TL1A includes termination resistors at the driver outputs and TM1A includes termination resistors at both the driver outputs and the receiver inputs.

FIG. 1 further illustrates schematically one example of the connections between the buffers 135, 145 or 155 of this invention. Each buffer 135, 145 and 155 preferably has a pass through for the power and ground lines. FIG. 1 illustrates power lines 173 supplied to both ends of a chain of buffers 135, 145 and 155. Likewise, FIG. 1 illustrates power lines 175 supplied to both ends of a chain of buffers 135, 145 and 155. Intermediate buffers 135, 145 and 155 receive power and ground coupled via the pass through of other buffers. It is known in the art to dispose a ground line between differential bus lines on a printed circuit. This ground line serves to isolate each pair of differential bus lines to reduce cross talk. FIG. 1 illustrates the connection of ground lines 177 to an integrated circuit socket between pairs of differential signal lines. Such a connection enables greater data transfer rates by isolating differential signal line pairs reducing cross talk between such pairs. Optionally power line 178 may also be connected between differential signal line pairs. Note that it is expected that these power and ground lines will be connected to the printed circuit board connections of power and ground which are connected to the integrated circuit. Also, note that the voltage of electrical power supplied to buffers 135, 145 and 155 need not be the same as supplied to integrated circuit 100. Thus, as an example, integrated circuit 100 may have signal output lines driven to a maximum voltage of 1.8 volts while buffers 135, 145 and 155 may couple to board signals having a maximum voltage of 3.3 volts. Additionally, socket 170 may include a level shifter 115 connected to line 113 from integrated circuit 100 sole for the purpose of voltage level conversion. Voltage level conversion circuits are known and need not be further described here. Note that the required power and ground lines to level shifter 115 are omitted as these connections are conventional.

FIG. 5 is a cross sectional view of the smart socket of this invention. In the preferred embodiment each buffer 135, 145 and 155 is an individual integrated circuit. Because there are very few MOS devices on these circuits, the integrated circuits embodying them will be very small. These integrated circuits will generally be much smaller than the integrated circuit 100 embodying a microprocessor or a memory. Each buffer 135, 145 or 155 is embedded in integrated circuit socket in close proximity to the corresponding integrated pin socket and the corresponding socket pin. It is anticipated that the integrated circuits embodying buffers 135, 145 and 155 will be as small as the distance between adjacent pins on the integrated circuit socket 200 or smaller. Thus, these integrated circuits can be disposed in close proximity to and in one-to-one correspondence with lines of the integrated circuit.

FIG. 5 further illustrates thermal dissipation devices coupled to the buffers 135, 145 or 155 of this invention. The buffers 135, 145 and 155 are embedded in integrated circuit socket 200. Integrated circuit socket 200 has an outer edge 210. Each of the buffers 135, 145 and 155 has a corresponding thermal slug 220. Each thermal slug 220 is in thermal contact with the corresponding buffer 135, 145 or 155. Each thermal slug 220 is also embedded in integrated circuit socket 200 and extends to outer edge 210. Each thermal slug 220 includes a distant end extending beyond the outer edge of integrated circuit socket 200. This distant end may include thermal fins in the manner known in the art. Air flow within the apparatus including the integrated circuit 100 and integrated circuit socket 200 serves to transport heat away from the buffer 135, 145 or 155. This airflow may be from a fan or due to natural convection. This construction enhances the flow of heat away from integrated circuit 100 and buffers 135, 145 and 155. Enhanced heat flow away from integrated circuit 100 and buffers 135, 145 and 155 supports high speed data transfer.

Though buffers 135, 145 and 155 are known, they have not previously been disposed in an integrated circuit socket in this manner. These buffers have previously been ganged together in another integrated circuit or formed of discrete components located further from the integrated circuit than the buffers 135, 145 and 155 of this invention. This placement of buffers 135, 145 and 155 has several advantages. The differential signals on the printed circuit board enabled by this invention are better able to support high speed data transfer than the single ended signals at the pins of the integrated circuits. Thus, high speed data transfer is possible. The distances between the buffers 135, 145, 155 and the corresponding integrated circuits are very short. The line capacitance will be low and thus operating these single ended lines at the same high speed as the differential signal lines is feasible over these very short distances. This means that a system employing this invention would have the advantages of high speed data movement between integrated circuits without requiring the increase in the number of pins connecting to the integrated circuit for differential outputs from the integrated circuit. Thus, a less expensive package having fewer pins may be used. Placing the buffers 145 and 155 in the integrated circuit socket has other advantages. Because these buffers must drive long printed circuit board lines, these buffers must be able to drive relatively large capacitive loads. Thus, this buffer must be constructed with MOS devices large relative to circuits on microprocessors and memories. Such large MOS devices require large amounts of electrical power relative to MOS devices employed for logic operations on integrated circuits. These MOS devices would contribute large amounts of heat to the integrated circuit, possibly requiring a more expensive integrated circuit package for thermal management. The separation of these buffers from the integrated circuit and the provision of additional thermal management features, thus enables a less expensive package with less aggressive thermal management features for the integrated circuits. The inventors anticipate that data clock rates of over 1 GHz can be achieved using this invention.

From the above descriptions is should be readily apparent that the smart integrated circuit socket can be employed in newly designed printed circuit boards to increase data transfer rates. FIGS. 6 and 7 illustrate how this invention can be used to improve performance of existing printed circuit boards. This alternative embodiment is useful in upgrading the performance of existing computer motherboards. Computer motherboards, such as used in desktop personal computers, include some components whose speed contribute greatly to the computer's computational capacity. These components include the microprocessor, the memory controller and the memory. Computer motherboards also include components whose speed contribute very little to the computational capacity of the computer. These components include the keyboard controller, the mouse controller, the modem, and the floppy disk controller. These components generally operate much slower than even the most modest computer motherboard. This alternative embodiment of the invention enables an upgrade of the computational capacity of a computer motherboard by replacing only those components whose speed is critical to the computational capacity of the computer and not replacing those less critical components.

The computer upgrade of this alternative embodiment of the invention replaces the microprocessor, memory controller and memory of the computer. It is typical for the computer motherboard to include integrated circuit sockets for these components. This enables field replacement of parts for upgrade or repair. In the case of dynamic random access memory (DRAM), it is typical to sell the computer with less than all of the memory sockets filled. This enables the user to increase the amount of memory after initial purchase by inserting new DRAMs into previously unused sockets. Other integrated circuits are directly coupled to the motherboard having their pins inserted into holes in the printed circuit board and being soldered in place. These components are not designed for field replacement. This alternative embodiment of the invention employs the fact that many integrated circuits critical to the computational capacity of the computer are coupled using sockets.

FIG. 6 illustrates a top plan view of the upgrade product of this alternative embodiment of this invention. The upgrade product consists of a plurality of smart integrated circuit sockets of the type described above connected together via a flexible mylar sheet having plural electrical connectors. In FIG. 6 the upgrade product includes socket 310 mating with the microprocessor unit (MPU) 313 and its socket 315, socket 320 mating with the memory control unit (MCU) 323 and its socket 325, and sockets 330 mating with the various DRAMs 313 and their respective sockets 335.

FIG. 7 is a sectional view of the upgrade product taken along line AA of FIG. 6. Note that the corner turn at the memory controller unit has been straightened for ease of illustration. In the sectional view of FIG. 7, the adaptor sockets 310, 320 and 330 of this invention are disposed between the originally installed sockets 315, 325 and 335 and the upgrade part. Some of the connections to the upgrade part are passed through the adaptor socket to the original socket. These connections are those of lower speed such as lines 110 and lines 120 discussed above. Pins corresponding to lines 130, 140 and 150, which employ respective active buffers 135, 145 and 155, are not connected to the prior lines on the printed circuit board. Instead, the connections of buffers 135, 145 and 155 are made via conductors on the flexible mylar sheet 340. These connections preferably include the intervening ground lines between pairs of differential signal lines as previously described. Thus, the flexible mylar sheet 340 carries the high speed signals according to this invention.

The upgrade is installed in the field as follows. The prior components such as the microprocessor, memory controller and memory integrated circuits are removed from their sockets. These original components are recycled or discarded. The adaptor sockets 310, 320 and 330 of the upgrade part are plugged into the respective original sockets 315, 325 and 335. As an alternative, many microprocessors are capable of operation at plural ratios to their bus frequency. These options are typically set via mode input pins to the microprocessor. The upgrade socket includes pin connections to these mode pins enabling the same microprocessor to operate at the same core frequency but at a higher bus frequency. The flexibility of the mylar sheet enables the adaptor sockets to be inserted into the original sockets without requiring simultaneous perfect alignment of all the adaptor sockets. The inventors contemplate that the upgrade product must be manufactured to mate with a particular motherboard design. This is necessary in order to provide minimum line lengths for the upgrade product. Finally, the upgrade integrated circuits are inserted into the corresponding adaptor sockets. These upgrade integrated circuits must support higher speed data transfers than the original integrated circuits in order to take advantage of the higher speed busses of the upgrade product. This upgrade product enables a field upgrade of the computer system to achieve higher computation capacity based upon higher data transfer rates between integrated circuits. At the same time, the upgrade product enables those components whose speed is less critical to the computer computational capacity to be retained.

As a further alternative, this upgrade product may advantageously be used in multiprocessor computer systems. These multiprocessor computer systems typically employ plural microprocessors connected to the same memory control unit. An upgrade product according to this invention with sockets for each processor and the memory control unit would enable replacement of just the memory controller unit. In this case, the memories would be unchanged. As a further alternative both the memory controller unit and memory may be replaced.

This application has discussed the data transfer between a microprocessor and corresponding memory of a computer system. Those skilled in the art would realize that this is merely a design example. The smart socket and upgrade product of this invention may be employed to increase data transfer rates to greater values than otherwise obtainable in any system requiring high speed data transfer.

What is claimed is:

1. An integrated circuit socket comprising:
   a plurality of pin sockets operable to receive and make electrical contact with corresponding pins of an integrated circuit;
   a plurality of socket pins operable to make electrical contact with a printed circuit board; and
   at least one active electronic component requiring electrical power for operation connecting at least one of said plurality of pin sockets to at least one corresponding socket pin of said plurality of socket pins,
   said at least one active electronic component including a single ended to differential input/output transceiver having a first input/output connected to a corresponding one of said plurality of pin sockets, a second input/output connected to a first corresponding one of said plurality of socket pins and a third input/output connected to a second corresponding one of said plurality of socket pins, said single ended to differential input/output transceiver
      operating in an output mode to drive said second and third input/outputs in opposite phase corresponding to a voltage on said first input/output, and
      operating in an input mode to drive a digital state at said first input/output corresponding to respective voltages on said second and third input/outputs,
   said single ended to differential transceiver further including an enable input, said single ended to differential transceiver operating in said output mode or in said input mode dependent upon a voltage at said enable input.

2. The integrated circuit socket of claim 1, wherein:
   said at least one active electronic component includes a differential input to single ended output driver having a first input connected to a first corresponding one of said plurality of socket pins, a second input connected to a second corresponding one of said plurality of socket pins and an output connected to a corresponding one of said plurality of pin sockets, said differential input to single ended output driver driving a digital state at said output corresponding to respective voltages on said first and second inputs.

3. The integrated circuit socket of claim 1, further comprising:
   a first passive termination resistor having a first terminal connected to said second input/output of said single ended to differential transceiver and a second terminal connected to electrical ground;
   a second passive termination resistor having a first terminal connected to said third input/output of said single ended to differential transceiver and a second terminal connected to electrical ground; and
   a third passive termination resistor having a first terminal connected to said second input/output of said single ended to differential input/output transceiver and a second terminal connected to said third input/output of said single ended to differential input/output transceiver.

4. The integrated circuit socket of claim 1, wherein:
   said single ended to differential transceiver further includes an enable input, said single ended to differential transceiver operating in said first mode or in said second mode dependent upon a voltage at said enable input.

5. An electronic system upgrade product comprising:
   at least two integrated circuit sockets, each integrated circuit socket including
      a plurality of pin sockets operable to receive and make electrical contact with corresponding pins of an integrated circuit;
      a plurality of socket pins operable to make electrical contact with a printed circuit board;
      at least one single ended to differential input/output transceiver, each single ended to differential input/output transceiver requiring electrical power for operation and having a first input/output connected to a corresponding one of said plurality of pin sockets, a second input/output connected to a first corresponding one of said plurality of socket pins and a third input/output connected to a second corresponding one of said second of socket pins, each single ended to differential input/output transceiver
         operating in an output mode to drive said second and third input/outputs in opposite phase corresponding to a voltage on said first input/output, and
         operating in an input mode to drive a digital state at said first input/output corresponding to respective voltages on said second and third input/outputs; and
   a flexible sheet including a plurality of electrical conductors, said plurality of electrical conductors includes at least one pair of electrical conductors connecting said second and third input/outputs of a single ended to the differential input/output transceiver of a first of said at least two integrated circuit sockets to respective second and third input/outputs of a corresponding single ended to the differential input/output transceiver of at least one additional of said at least two integrated circuit sockets.

6. The electronic system upgrade product of claim 5, wherein:
   said flexible sheet disposes a conductor connected to electrical ground between each pair of electrical conductors connecting said second and third input/outputs of respective single ended to differential input/output transceivers of differing integrated circuit sockets.

7. The electronic system upgrade product of claim 5, further comprising:
   a first passive termination resistor having a first terminal connected to said second input/output of at least one single ended to differential transceiver of at least one integrated circuit socket and a second terminal connected to electrical ground;
   a second passive termination resistor having a first terminal connected to said third input/output of said single ended to differential transceiver and a second terminal connected to electrical ground; and
   a third passive termination resistor having a first terminal connected to said second input/output of said single ended to differential input/output transceiver and a second terminal connected to said third input/output of said single ended to differential input/output transceiver.

8. The electronic system upgrade product of claim 5, wherein:
   at least one of said single ended to differential transceivers further includes an enable input, said single ended to differential transceiver operating in said output mode or in said input mode dependent upon a voltage at said enable input.

9. The electronic system upgrade product of claim 5, wherein:

at least one of said integrated circuit sockets includes a single ended input to differential output driver having an input connected to a corresponding one of said first plurality of pin sockets, a first output connected to a first corresponding one of said second plurality of socket pins and a second output connected to a second corresponding one of said second plurality of socket pins, said single ended input to differential output driver driving said first and second outputs in opposite phase corresponding to a voltage on said input.

10. The electronic system upgrade product of claim 9, further comprising:

a first passive termination resistor having a first terminal connected to said first output of said single ended input to differential output driver and a second terminal connected to electrical ground; and a second passive termination resistor having a first terminal connected to said second output of said single ended input to differential output driver and a second terminal connected to electrical ground.

11. The electronic system upgrade product of claim 5, wherein:

at least one of said integrated circuit sockets includes a differential input to single ended output driver having a first input connected to a first corresponding one of said second plurality of socket pins, a second input connected to a second corresponding one of said second plurality of socket pins and an input connected to a corresponding one of said first plurality of pin sockets, said differential input to single ended output driver driving a digital state at said second output corresponding to respective voltages on said first and second inputs.

12. The electronic system upgrade product of claim 11, further comprising:

a passive termination resistor having a first terminal connected to said first input of said differential input to single ended output driver and a second terminal connected to said second input of differential input to single ended output driver.

* * * * *